(12) United States Patent
Verhulst (10) Patent No.: US 7,893,476 B2
(45) Date of Patent: Feb. 22, 2011

(54) TUNNEL EFFECT TRANSISTORS BASED ON SILICON NANOWIRES

(75) Inventor: Anne S. Verhulst, Houtvenne (BE)

(73) Assignee: IMEC, Leuven (BE)

( * ) Notice: Subject to any disclaimer, the term of this patent is extended or adjusted under 35 U.S.C. 154(b) by 523 days.

(21) Appl. No.: 11/765,945

(22) Filed: Jun. 20, 2007

(65) Prior Publication Data

US 2008/0067495 A1 Mar. 20, 2008

Related U.S. Application Data

(60) Provisional application No. 60/845,006, filed on Sep. 15, 2006.

(30) Foreign Application Priority Data

Nov. 27, 2006 (EP) .................................. 06024507

(51) Int. Cl.
*H01L 21/336* (2006.01)
(52) U.S. Cl. ............... 257/296; 257/306; 257/401; 257/E27.086; 257/E29.134; 257/E29.264; 438/301; 438/96; 438/365; 977/700; 977/762
(58) Field of Classification Search ........... 257/296, 257/306, 401, E27.086, E29.134, E29.264, 257/E33.004, E31.001; 438/301, 96, 365, 438/482; 977/700, 762
See application file for complete search history.

(56) References Cited

U.S. PATENT DOCUMENTS

| 5,471,075 | A * | 11/1995 | Shekar et al. ............... 257/139 |
|---|---|---|---|
| 7,425,491 | B2 * | 9/2008 | Forbes ......................... 438/301 |
| 7,446,372 | B2 * | 11/2008 | Forbes ......................... 257/328 |
| 7,491,995 | B2 * | 2/2009 | Forbes ......................... 257/296 |
| 2004/0262636 | A1 * | 12/2004 | Yang et al. ................... 257/200 |
| 2005/0274992 | A1 | 12/2005 | Appenzeller et al. |
| 2006/0258072 | A1 * | 11/2006 | Kavalieros et al. .......... 438/197 |
| 2007/0001232 | A1 * | 1/2007 | King et al. ................... 257/368 |
| 2007/0178650 | A1 * | 8/2007 | Chen et al. ................... 438/301 |
| 2008/0067607 | A1 * | 3/2008 | Verhulst et al. ............. 257/371 |

OTHER PUBLICATIONS

Bhuwalka et al. IEEE transactions on electron devices vol. 52, No. 7, Jul. 2005.
Glas, F. "Critical dimensions for the plastic relaxation of strained axial heterostructures in free-standing nanowires", Phys. Rev. B 74, 121302(R) (2006).

* cited by examiner

*Primary Examiner*—Mary Wilczewski
*Assistant Examiner*—Telly D Green
(74) *Attorney, Agent, or Firm*—Knobbe Martens Olson & Bear LLP (57) ABSTRACT

Tunnel field-effect transistors (TFETs) are regarded as successors of metal-oxide semiconductor field-effect transistors (MOSFETs), but silicon-based TFETs typically suffer from low on-currents, a drawback related to the large resistance of the tunnel barrier. To achieve higher on-currents a nanowire-based TFET with a germanium (Ge) tunnel barrier in an otherwise silicon (Si) channel is used. A nanowire is introduced such that the lattice mismatch between silicon and germanium does not result in a highly defective interface. A dynamic power reduction as well as a static power reduction can result, compared to conventional MOSFET configurations. Multiple layers of logic can therefore be envisioned with these nanowire Si/Ge TFETs resulting in ultra-high on-chip transistor densities.

33 Claims, 7 Drawing Sheets

TUNNEL EFFECT TRANSISTORS BASED ON SILICON NANOWIRES

CROSS-REFERENCE TO RELATED APPLICATIONS

This application claims the benefit under 35 U.S.C. §119 (e) of U.S. provisional application Ser. No. 60/845,006, filed Sep. 15, 2006, and claims the benefit under 35 U.S.C. §119 (a)-(d) of European application No. EP 06024507.3, filed Nov. 27, 2006, the disclosures of which are hereby expressly incorporated by reference in their entireties and are hereby expressly made a portion of this application.

FIELD OF THE INVENTION

The present invention is related to the field of semiconductor devices and nanotechnology. More specifically, the invention is related to a nanostructure semiconductor device, more specifically to a tunnel field effect transistor having a heterostructure nanowire, and a method for manufacturing such tunnel field effect transistor devices with integrated nanowires.

BACKGROUND OF THE INVENTION

Microelectronic devices are generally fabricated on semiconductor substrates as integrated circuits. A complementary metal-oxide-semiconductor (CMOS) field effect transistor is one of the core elements of the integrated circuits. Dimensions and operating voltages of CMOS transistors are continuously reduced, or scaled down, to obtain ever-higher performance and packaging density of the integrated circuits.

One of the problems due to the scaling down of CMOS transistors is that the power consumption keeps increasing. This is partly because leakage currents are increasing (e.g. due to short channel effects) and because it becomes difficult to decrease the supply voltage. The latter is mainly due to the fact that the subthreshold slope is limited to minimally about 60 mV/decade, such that switching the transistor from ON to OFF needs a certain voltage variation and therefore a minimum supply voltage.

Tunnel field-effect transistors (TFETs) are typically advertised as successors of metal-oxide semiconductor field-effect transistors (MOSFETs), because of their absence of short-channel effects and because of their resulting low off-currents. Another advantage of TFETs is that the subthreshold slope can be less than 60 mV/dec, the physical limit of conventional MOSFETs, such that potentially lower supply voltages can be used. However, TFETs typically suffer from low on-currents, a drawback related to the large resistance of the tunnel barrier.

In US 2005/0274992, a method of fabricating an improved TFET using nanowires is disclosed. The method comprises forming in a nanotube (i.e. a nanowire without axial opening) an n-doped region and a p-doped region that are separated by an undoped channel region of the transistor. Electrical contacts are provided for the doped regions and a gate electrode that is formed upon a gate dielectric layer is deposited on the channel region of the transistor. The proposed structure still has the disadvantage of introducing new materials (carbon nanotubes).

To increase the on-current of a silicon TFET, suggestions have been made in literature by Bhuwalka et al. (IEEE transactions on electron devices Vol. 52, No. 7, July 2005) to add a small (about 3 nm wide) section of highly-doped $Si_{1-x}Ge_x$ at the tunnel barrier. The $Si_{1-x}Ge_x$ has a smaller band gap than Si such that the tunnel barrier width decreases due to the presence of this section. However, these structures with the $Si_{1-x}Ge_x$ section, can still not compete with conventional MOSFETs because of their low on-currents.

As a conclusion, there is still a need for an improved method of fabricating a nanowire tunnel field effect transistor.

SUMMARY OF THE INVENTION

It is an object of the present invention to provide semiconductor device structures with an improved architecture and having low power consumption using nanostructures such as nanowires and to the method for the manufacturing of such semiconductor device structures.

The invention discloses the creation of a tunnel field effect transistor having at least one nanowire (further referred to as a NW-TFET), said nanowire comprising the channel region, source/drain regions and a heterosection. Said heterosection is situated in between the channel region and one of the source/drain regions.

It is further an advantage of the NW-TFET of the present invention that Si based materials and process knowledge can be used to create the NW-TFET such that the NW-TFET can be easily processed and incorporated in current Si-based technology devices.

Embodiments of the invention relate to micro and nanoelectronics and are preferably but not always, used for developing low power semiconductor device structures. Using the tunnel field effect transistor of the invention it is possible to increase the number of transistors on a chip further. The nanowire tunnel field effect transistor of some embodiments of the invention can be based on current Si based technology and can therefore be easily incorporated in current devices using current state of the art technologies. The nanowire tunnel field effect transistor of some of the embodiments is distinguished from all analogous TFETs known in prior art by the integration of an appropriate heterosection. A heterosection is a section along the longitudinal axis of a nanowire which is made of a material which is different from the material of the main part of the nanowire. The heterosection can help enable an improved performance in terms of any or all of: high ON currents (the resistance associated with the tunnel barrier can be decreased by using a material with a very small bandgap for the heterosection), low OFF currents (the off-current is determined by the material of the main part of the nanowire, and can be chosen independently of the material of the heterosection) and fast OFF-to-ON transition (as simulations have indicated, in the presence of a heterosection, whereby the heterosection material has a smaller bandgap than the material of the main part of the nanowire, the OFF-to-ON transition becomes faster). The interface between the material of the main part of the nanowire and the heterosection can be substantially defect-free, i.e. it does not result in a highly defective interface, because this is a nanowire and the very small cross section allows for efficient lateral stress relaxation. An example is a silicon nanowire with a germanium heterosection, where the lattice mismatch between silicon and germanium does not result in a highly defective interface.

In a preferred embodiment of the invention, a Tunnel Field Effect Transistor (TFET) semiconductor device is disclosed. Said TFET comprises at least one nanowire (to form a NW-TFET), said nanowire further comprising at least one source region made of a first semiconductor material which is highly doped according to a first conductivity type, e.g. p doped (or n doped), at least one drain region made of a first semiconductor material which is highly doped according to a second conductivity type, e.g. n doped (or p doped), at least one channel region made of a first semiconductor material which is lowly doped according to the second conductivity type, e.g. n doped (or p doped), and which is situated in between the source and drain region and a heterosection made of a second semiconductor material which is highly doped and which is situated in between the source region (or drain region) and the channel region.

In an alternative embodiment and also preferred, said heterosection can be made of a metal such as Al, W, Ta, Ti, Ru, Pd, Rh, Re, Pt, and alloys thereof, a silicide, a germanide, a metal-nitride such as TaN and TiN, a conductive oxide such as $RuO_2$ and $ReO_2$, a silicided metal such as $CoSi_2$, $NiSi_2$, a metal germanide and/or alloys and mixtures thereof.

The Tunnel Field Effect Transistor (NW-TFET) further comprises a gate structure, said gate structure preferably made of a gate dielectric, e.g. gate oxide, situated onto the channel region of the NW-TFET and a gate contact situated on top of the gate dielectric, e.g. gate oxide. The gate dielectric is preferably selected from at least one of silicon based oxide (e.g. silicon dioxide, silicon oxy nitride) aluminum oxide, high-k oxides (oxides, nitrided oxides), silicates and nitrided silicates of transition metals such as Hf, Ta, Ti, Nb, V, Y, Zr. Most preferred the gate oxide is a high-k oxide such as hafnium oxide. The thickness of the gate dielectric is preferably in the range of 0.5 nm to 20 nm. The gate contact is preferably made of a conductive material and is selected from at least one of poly silicon, poly germanium, metals such as Al, W, Ta, Ti, Ru, Pd, Rh, Re, Pt, and alloys thereof, metal-nitrides such as TaN and TiN, metal-silicon nitrides such as TaSiN, conductive oxides such as $RuO_2$ and $ReO_3$, fully silicided metals (FUSI) such as $CoSi_2$, NiSi and $TiSi_2$, fully germanided metals (FUGE). The gate contact is chosen such that a particular gate workfunction is obtained specifically for the chosen nanowire material (first and second semiconductor material), gate dielectric and gate dielectric thickness. Most preferred the gate structure (containing the gate contact and gate dielectric) of the NW-TFET covers completely the channel region of the nanowire.

The Tunnel Field Effect Transistor (NW-TFET) of some embodiments of the present invention further comprises an electrical contact on each of the source region and drain region. Preferably the electrical contact on each of the source region and drain region is a conductive material which is selected from at least one of a silicide containing structure (NiSi, $CoSi_2$, $TiSi_2$, and the like), a germanide containing structure, a metal containing structure, poly silicon or a combination thereof. More preferred is that said electrical contact on each of the source region and drain region is a combination of a metal with a silicide.

The first semiconductor material in the NW-TFET of the present invention is preferably selected from at least one of group IV materials such as Si, Ge, C and binary compounds thereof, or group III/V materials such as In, Ga, As, Sb, Al, P, B, N and binary, tertiary and quaternary compounds thereof or group II/VI materials such as Cd, Zn, S, Se, Te, O and binary, tertiary and quaternary compounds thereof. Most preferred is that the first semiconductor material in NW-TFET of the present invention is silicon.

The second semiconductor material in the NW-TFET of the present invention is preferably made of a material that has a different lattice constant from the first semiconductor material of the NW-TFET. Preferably said second semiconductor material is selected from at least one of group IV materials such as Si, Ge, C and binary compounds thereof, or group III/V materials such as In, Ga, As, Sb, Al, P, B, N and binary, tertiary and quaternary compounds thereof or group II/VI materials such as Cd, Zn, S, Se, Te, O and binary, tertiary and quaternary compounds thereof. Most preferred the second semiconductor material in NW-TFET of the present invention is germanium or $Si_{1-x}Ge_x$ with $x>0.5$.

The diameter of the NW, perpendicular to its longitudinal axis, used in the NW-TFET of some embodiments of the present invention is preferably in the range of 1 nm up to 500 nm, more preferred the diameter of the NW used in the NW-TFET of the present invention is between 2 and 200 nm.

The length of the NW, along its longitudinal axis used in the NW-TFET of some embodiments of the present invention is preferably in the range of 5 nm and 2 µm, more preferred the length of the NW used in the NW-TFET of the present invention is between 10 nm and 1 µm.

The length of the heterosection in the NW-TFET of some embodiments of the present invention is preferably in the range of 1 nm and 50 nm, more preferred the length of the heterosection in the NW-TFET of the present invention is between 2 nm and 10 nm.

The length of the channel region in the NW-TFET of some embodiments of the present invention is preferably in the range of 1 nm and 1000 nm, more preferred the length of the channel region in the NW-TFET of the present invention is between 1 nm and 100 nm.

The doping level of the source region and drain region in the NW-TFET of some embodiments of the present invention is preferably in the range of $10^{18}$/cc to $10^{21}$/cc, more preferred the doping level of the source region and drain region in the NW-TFET is in the range of $10^{19}$/cc to $5 \times 10^{20}$/cc.

The doping level of the heterosection in the NW-TFET of the present invention is preferably in the range of $10^{18}$/cc to $10^{21}$/cc, more preferred the doping level of the heterosection in the NW-TFET is in the range of $10^{19}$/cc to $5 \times 10^{20}$/cc.

The doping level of the channel region in the NW-TFET of the present invention is preferably in the range of undoped up to $10^{16}$/cc, more preferred the doping level of the channel region in the NW-TFET is in the range of undoped up to $5 \times 10^{14}$/cc.

Furthermore a method for manufacturing a NW-TFET semiconductor device is disclosed whereby said method comprises the steps of:

providing a substrate lying in a plane, providing on said substrate a source contact onto which optionally a catalyst is deposited, growing a nanowire structure, said nanowire having an integrated source region, a channel region, a heterosection and a drain region whereby said source region, channel region and drain region are made of a first semiconductor material and the heterosection is made of a material having a different lattice constant from the first semiconductor material, selectively doping said source region, channel region, heterosection and drain region to the desired doping level and dopant type.

Further steps of some embodiments of the method can involve one or more of:

depositing on the side walls of the nanowire a gate dielectric, e.g. gate oxide, depositing on top of the gate dielectric a gate contact, and forming a drain contact on top of the drain region of the nanowire.

In a preferred embodiment, the substrate used for manufacturing a NW-TFET is a Si wafer.

In a preferred embodiment, said first semiconductor material is selected from at least one of group IV materials such as Si, Ge, C and binary compounds thereof, or group III/V materials such as In, Ga, As, Sb, Al, P, B, N and binary, tertiary and quaternary compounds thereof or group II/VI materials such as Cd, Zn, S, Se, Te, O and binary, tertiary and quaternary compounds thereof and most preferred said first semiconductor material is silicon.

In a preferred embodiment, said heterosection is made of a second semiconductor material, whereby said second semiconductor material is such that it has a different lattice constant from the first semiconductor material of the nanowire.

In a preferred embodiment, said second semiconductor material is selected from at least one of the group IV materials such as Si, Ge, C and binary compounds thereof, or group III/V materials such as In, Ga, As, Sb, Al, P, B, N and binary, tertiary and quaternary compounds thereof or group II/VI materials such as Cd, Zn, S, Se, Te, O and binary, tertiary and quaternary compounds thereof and most preferred said second semiconductor material is germanium or $Si_{1-x}Ge_x$ with x>0.5.

Alternatively and also preferred, said heterosection can be made of metals (Al, W, Ta, Ti, Ru, Pd, Rh, Re, Pt, and alloys thereof), silicides, germanides, metal-nitrides such as TaN and TiN, conductive oxides such as $RuO_2$ and $ReO_2$, silicided metals such as $CoSi_2$, $NiSi_2$, metal germanides and alloys and mixtures thereof.

In a preferred embodiment the diameter of the nanowire is between 1 and 500 nm. More preferred the diameter of the nanowire is between 2 and 200 nm.

In a preferred embodiment the length of the nanowire is between 5 nm and 2 µm. More preferred the length of the nanowire is between 10 nm and 1 µm.

In a preferred embodiment the gate dielectric is selected from at least one of silicon based oxide (e.g. silicon dioxide, silicon oxy nitride) aluminum oxide, high-k oxides (oxides, nitrided oxides), silicates and nitrided silicates of transition metals such as Hf, Ta, Ti, Nb, V, Y, Zr. More preferred the gate oxide is a high-k oxide such as hafnium oxide.

In a preferred embodiment the gate contact is made of a conductive material and is selected from at least one of poly silicon, poly germanium, metals such as Al, W, Ta, Ti, Ru, Pd, Rh, Re, Pt, and alloys thereof, metal-nitrides such as TaN and TiN, metal-silicon nitrides such as TaSiN, conductive oxides such as $RuO_2$ and $ReO_3$, fully silicided metals (FUSI) such as $CoSi_2$, NiSi and $TiSi_2$, fully germanided metals (FUGE), workfunction tunable metals, engineered materials to obtain a particular gate workfunction. More preferred the gate contact is made of a metal of which the workfunction has been engineered specifically for the chosen nanowire material (first and second semiconductor material).

In a preferred embodiment the source and drain are made from a conductive material which is selected from at least one of a silicide containing structure (NiSi, $CoSi_2$, $TiSi_2$, ... ), a germanide containing structure, a metal containing structure, poly silicon or a combination thereof. More preferred said source and drain is a combination of a metal with a silicide.

In a preferred embodiment the length of said heterosection is in the range of 1 nm up to 50 nm. More preferred the length of said heterosection is in the range of 2 nm to 10 nm.

In a preferred embodiment the length of said channel region is in the range of 1 nm to 1000 nm. More preferred the length of said channel region is in the range of 1 nm to 100 nm.

In a preferred embodiment the thickness of the gate dielectric is in the range of 0.5 nm to 20 nm.

In a preferred embodiment the doping level of the source region and drain region is in the range of $10^{18}$/cc to $10^{21}$/cc. More preferred the doping level of the source region and drain region is in the range of $10^{19}$/cc to $5\times10^{20}$/cc.

In a preferred embodiment the doping level of the heterosection is in the range of $10^{18}$/cc to $10^{21}$/cc. More preferred the doping level of the heterosection is in the range of $10^{19}$/cc to $5\times10^{20}$/cc.

In a preferred embodiment the doping level of the channel region is in the range of undoped up to $10^{16}$/cc doping. More preferred the doping level of the channel region is in the range of undoped up to $10^{14}$/cc doping.

For the application in tunnel field-effect-transistor (TFET) devices said nanowire forms the channel and source/drain regions of the tunnel field-effect transistor.

The above and other characteristics, features and advantages of the present invention will become apparent from the following detailed description, taken in conjunction with the accompanying drawings, which illustrate, by way of example, the principles of the invention. This description is given for the sake of example only, without limiting the scope of the invention. The reference figures quoted below refer to the attached drawings.

BRIEF DESCRIPTION OF THE DRAWINGS

All figures/drawings are intended to illustrate some aspects and embodiments of the present invention. Devices are depicted in a simplified way for reason of clarity. Not all alternatives and options are shown and therefore the invention is not limited to the content of the given drawings. Like numerals are employed to reference like parts in the different figures.

DETAILED DESCRIPTION OF THE PREFERRED EMBODIMENT

Embodiments of the present invention will be described with respect to particular embodiments and with reference to certain drawings but the invention is not limited thereto but only by the claims. The drawings described are only schematic and are non-limiting. In the drawings, the size of some of the elements may be exaggerated and not drawn to scale for illustrative purposes. The dimensions and the relative dimensions do not correspond to actual reductions to practice of the invention.

Furthermore, the terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

Moreover, the terms top, bottom, over, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

Whenever reference is made hereinafter to a particular dopant type, this is done for the ease of explanation only and is not intended to limit the invention. It is to be understood that in the examples given herein below, materials and dopant types may be replaced by other suitable materials and dopant types, without changing the invention.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

The invention will now be described by a detailed description of several embodiments of the invention. It is clear that other embodiments of the invention can be configured according to the knowledge of persons skilled in the art without departing from the true spirit or technical teaching of the invention, the invention being limited only by the terms of the appended claims. In particular, some embodiments of the invention will be described with reference to nanowires, however, this is not intended to limit the invention, and is intended to encompass any example of an elongate nanostructure, which may include nanorods, nanowhiskers and other elongated substantially cylindrical or polygonal structures having a longitudinal axis.

At least some embodiments of the present invention are concerned with the problem of too low ON currents in existing tunnel field effect transistors (TFET). A heterosection is introduced, situated in between the channel region and the source (or drain) region of the TFET. Some embodiments of said TFET can be further characterized as a TFET whereby the source, drain and channel regions are fabricated in a nanowire made of a semiconducting material and the heterosection is further characterized as a section made of a material with a different lattice constant from the semiconductor material of the nanowire and whereby the heterosection is situated in between the channel region and the source (or drain) region in the nanowire. A heterosection is a section along the longitudinal axis of a nanowire which is made of a material which is different from the material of the main part of the nanowire. The use of a different material for the nanowire and the heterosection implies that the lattice constant will be different. As an example: if SiGe with a very small Ge content is used for the heterosection, then the lattice constant will be different from the lattice constant of pure Si used for the nanowire, but the difference will be very small, such that it can still be grown on top of Si without an excessive amount of dislocations. A TFET device whereby the channel region and the source/drain regions are fabricated in a nanowire is further referred to in this application as a NW-TFET.

At least some of the embodiments of the present invention relate to the creation of semiconductor devices and more specifically to the creation of a nanowire Tunnel-Field Effect Transistor (NW-TFET) on a semiconductor substrate. A NW-TFET structure is disclosed whereby the nanowire is made of a first semiconductor material and comprises a first source/drain section having a first doping level and first doping composition. The NW-TFET further comprises a second source/drain sections having a second doping level and second doping composition. Most preferred a p-doped section is situated at the one end of the nanowire and an n-doped section is situated in the other end of the nanowire. A heterosection made of a heterosection material can also be situated on the nanowire whereby the heterosection material is such that it has a different lattice constant from the first semiconductor material of the nanowire, and whereby the resulting NW-TFET has an improved performance compared to the TFET consisting of the semiconductor nanowire without a heterosection. This is because the subthreshold slope can be steeper, which allows reducing the power supply and therefore the power consumption.

In a first embodiment of the invention, NW-TFETs using semiconducting nanowires are disclosed. TFETs using nanowires are known from the prior art (e.g. in US 2005/0274992) whereby said nanowire comprises a n-doped region and a p-doped region which is separated by an undoped channel region made of the same semiconducting material. However, none of the prior art devices includes a heterosection in between the source (or drain) region and the channel region whereby the heterosection is such that it has a different lattice constant than the semiconductor material of the nanowire. This can enable a performance improvement in that low ON currents (less than the International Technology Roadmap for Semiconductors ITRS roadmap predictions, which are currently predicting ON currents on the order of 1 mA/μm for a low power operating technology), a typical drawback related to the large resistance of the tunnel barrier in semiconductors with a bandgap of at least 1 eV (e.g. silicon), can be reduced or eliminated.

Figure 1:
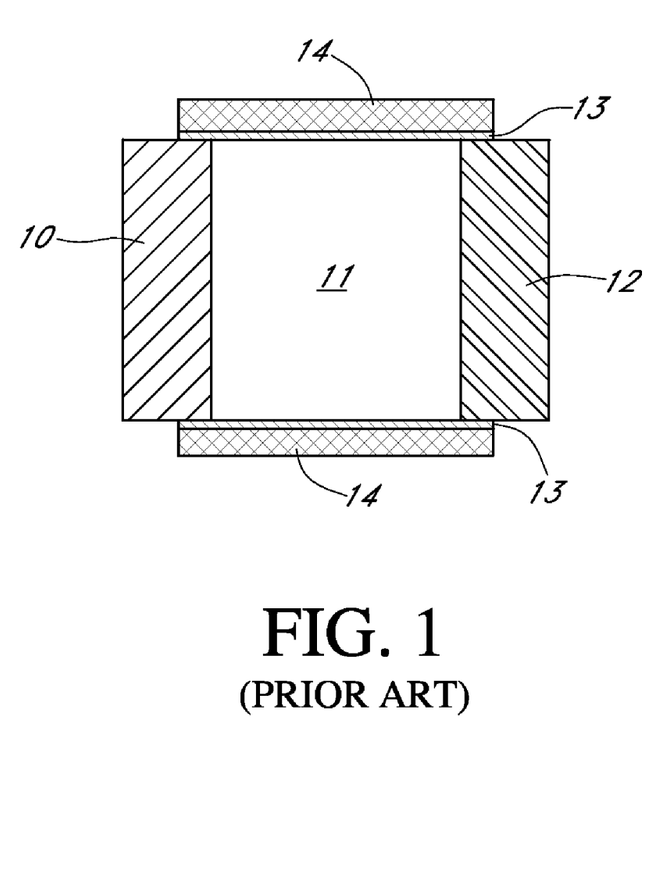
FIG. 1 (PRIOR ART) shows a schematic diagram of a TFET.
Figure 5A:
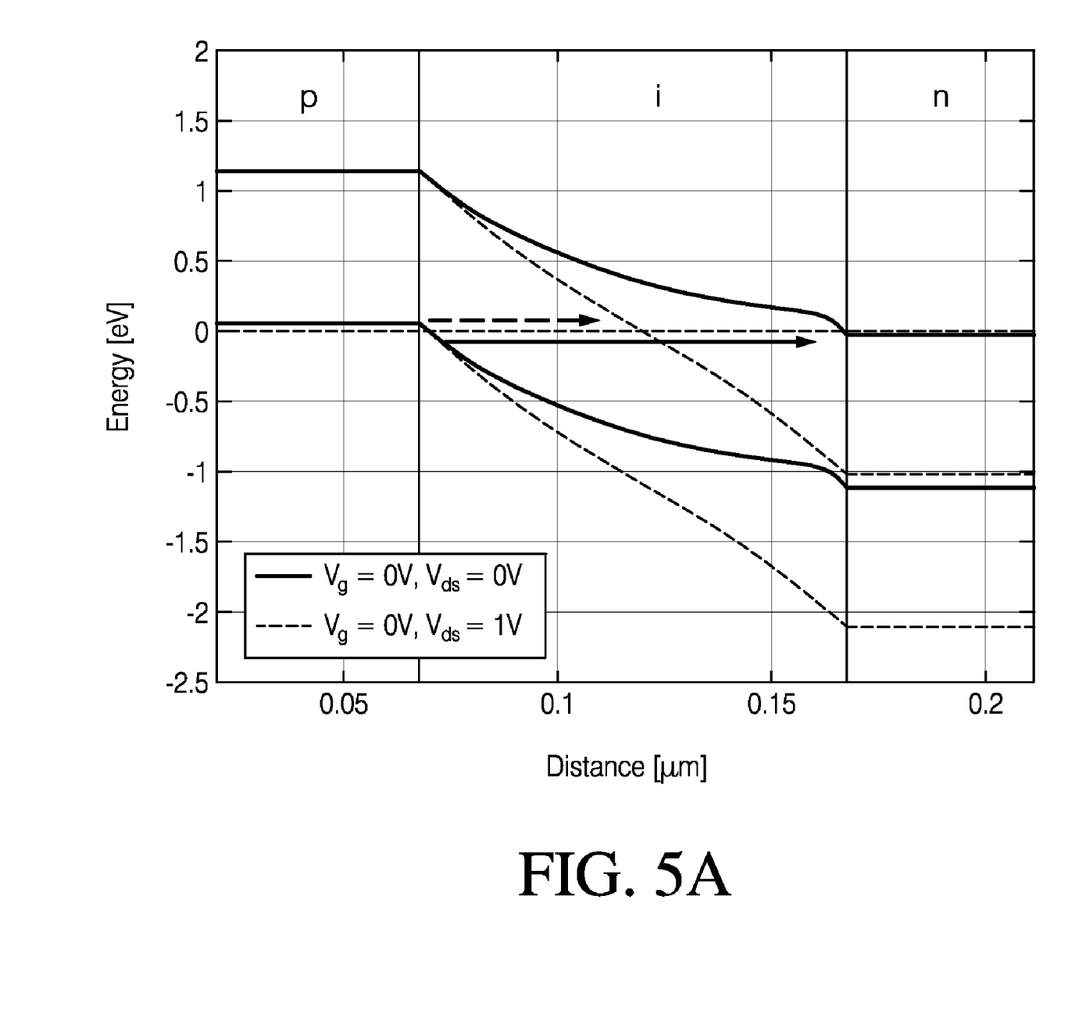
FIG. 5A shows a typical energy band diagram of a TFET as shown in FIG. 1 (prior art) without and with applied drain-source bias (no gate bias applied). The arrows indicate the tunnel barrier which needs to be crossed.

A traditional TFET (without having nanostructures) as shown in FIG. 1 and described in the prior art is in fact a p-i-n diode, which is reverse biased and gated. The reverse bias turns the diode off. However, when a sufficiently large reverse bias is applied, quantum mechanical tunneling occurs of electrons from the valence band (in the p-doped section) to the conduction band (in the n-doped section), an effect usually called Zener breakdown. This is shown in FIG. 5A, which displays the band diagram of an unbiased and a reverse biased p-i-n diode. The arrow in FIG. 5A indicates the tunnel barrier which needs to be crossed. In a TFET, this tunnel effect is desired and represents the on-state of the transistor. The amount of current in the on-state is determined by the tunnel barrier width. The barrier width is the smallest when there is a highly doped region at either side of the tunnel barrier. This requires a highly doped source (or drain) section and a gate voltage such that a large carrier concentration is created in the intrinsic region next to the source (or drain) (see FIG. 5B for the effect of a gate bias on the tunnel barrier width). The tunnel barrier width further decreases with decreasing band gap. When comparing this device with a MOSFET, there are a few differences, but many similarities. The MOSFET has either a p-doped source and drain (p-MOSFET) or an n-doped source and drain (n-MOSFET), whereas the TFET has a p-doped source and an n-doped drain, or vice versa. The channel, however, is lowly doped in both devices, and a gate voltage is applied to create a high-mobility channel. Therefore, if the resistance associated with the tunnel barrier can be made sufficiently small, the on-current of a TFET can in principle become comparable to the on-current of a MOSFET (usually the on-current of a TFET is, however, significantly smaller than the on-current of the corresponding MOSFET). The off-currents of a TFET are typically very small, which is due to the presence of the tunnel barrier. The conventional MOSFET on the other hand suffers from short-channel effects which results in source-drain leakage currents, especially as the device size scales down.

The NW-TFET of some embodiments of the present invention solves or mitigates the problem of low ON currents by introducing a small heterosection at the tunnel barrier of the channel, said heterosection is preferably made of a highly doped material which has preferably a smaller bandgap than the material used for source, drain and channel regions of the nanowire.

The NW-TFET of some embodiments of the invention can further be characterized as a TFET having at least one nanowire. Said nanowire comprises the source region, channel region and drain regions of the TFET device as well as the novel heterosection being situated at the tunnel barrier of the channel region. More specifically said heterosection can be situated in between the source region and the channel region of the nanowire. Alternatively said heterosection can be situated in between the drain region and the channel region of the nanowire.

The nanowire in the NW-TFET of some embodiments of the present invention can be characterized as a semiconducting nanowire wherein the diameter of the nanowire is between 1 and 500 nm and the length of the nanowire is between 5 nm and 2 μm. More preferred the diameter of the nanowire is between 2 nm and 200 nm and the length of the nanowire is between 10 nm and 1 μm.

The source region of the NW-TFET is made of a first semiconductor material which is highly p doped in case of an n-type NW-TFET, or alternatively in case of a p-type NW-TFET said source region is highly n doped. More preferred the doping level of the source region is in the range of $10^{18}$/cc to $10^{21}$/cc. Most preferred the doping level of the source region is in the range of $10^{19}$/cc to $5.10^{20}$/cc. Said doping can be performed during the growth of the nanowire (e.g. by adding the appropriate doping gases during the growth) or after growth of the nanowire.

The drain region of the NW-TFET is made of a first semiconductor material which is highly n doped in case of an n-type NW-TFET, or alternatively in case of a p-type NW-TFET said source region is highly p doped. More preferred the doping level of the drain region is in the range of $10^{18}$/cc to $10^{21}$/cc. Most preferred the doping level of the drain region is in the range of $10^{19}$/cc to $5.10^{20}$/cc. Said doping can be performed during the growth of the nanowire (e.g. by adding the appropriate doping gases during the growth) or after growth of the nanowire.

The channel region of the NW-TFET is also fabricated in the nanowire and is also made of a first semiconductor material. The channel region of the NW-TFET is situated in between the source and drain region. Preferably the doping level of the channel region is in the range of undoped up to $10^{16}$/cc doping. More preferred the doping level of the channel region is in the range of undoped up to $10^{14}$/cc doping. Said doping can be performed during the growth of the nanowire (e.g. by adding the appropriate doping gases during the growth) or after growth of the nanowire.

The first semiconductor material used to fabricate at least the source/drain region and channel region of the nanowire is selected from at least one of group IV materials such as Si, Ge, C and binary compounds thereof, or group III/V materials such as In, Ga, As, Sb, Al, P, B, N and binary, tertiary and quaternary compounds thereof or group II/VI materials such as Cd, Zn, S, Se, Te, O and binary, tertiary and quaternary compounds thereof. Most preferred said first semiconductor material is silicon.

The length of the channel region is preferably in the range of 1 nm to 1000 nm, more preferred in the range of 1 nm to 100 nm.

The heterosection is preferably made of a second semiconductor material whereby said second semiconductor material is such that it has a different lattice constant from the first semiconductor material of the nanowire. Said second semiconductor material is highly doped and is selected from at least one of the group IV materials such as Si, Ge, C and binary compounds thereof, or group III/V materials such as In, Ga, As, Sb, Al, P, B, N and binary, tertiary and quaternary compounds thereof or group II/VI materials such as Cd, Zn, S, Se, Te, O and binary, tertiary and quaternary compounds thereof. Most preferred said second semiconductor material is germanium or $Si_{1-x}Ge_x$ with x>0.5.

The doping level of the heterosection is preferably in the range of $10^{18}$/cc to $10^{21}$/cc, more preferred the doping level of the heterosection is in the range of $10^{19}$/cc to $5 \times 10^{20}$/cc. The doping level of the heterosection is preferably equal (or higher) than the doping level in source and drain regions of the NW-TFET.

Alternatively and also preferred, said heterosection can be made of metals (Al, W, Ta, Ti, Ru, Pd, Rh, Re, Pt, and alloys thereof), silicides, germanides, metal-nitrides such as TaN and TiN, conductive oxides such as $RuO_2$ and $ReO_2$, silicided metals such as $CoSi_2$, $NiSi_2$, metal germanides and alloys and mixtures thereof.

The length of the heterosection is preferably in the range of 1 nm up to 50 nm, more preferred the length of said heterosection is in the range of 2 nm up to 10 nm.

Onto the sidewalls of the nanowire, more specifically onto the sidewalls of the channel region of the nanowire, a gate structure is situated. Said gate structure can comprise a gate oxide (also referred to as gate dielectric) and a gate electrode (also referred to as gate contact). The gate oxide is making direct contact to the channel region of the nanowire; more specifically said gate oxide completely covers the outer sidewalls of the channel region. To ensure such a complete coverage, a small overlap of the gate oxide with the highly-doped drain and source region is desirable. Onto the gate oxide, a gate contact is deposited; said gate contact is thus situated on top of said gate oxide and is preferably covering the whole gate oxide. The gate structure, comprising gate oxide and gate contact, as described above can also be referred to as an all around gate structure.

The gate oxide is preferably selected from at least one of silicon based oxide (e.g. silicon dioxide, silicon oxy nitride) aluminum oxide, high-k oxides (oxides, nitrided oxides), silicates and nitrided silicates of transition metals such as Hf, Ta, Ti, Nb, V, Y, Zr. Most preferred said gate oxide is a high-k oxide such as hafnium oxide. The thickness of the gate oxide is preferably in the range of 0.5 nm to 20 nm.

The gate contact is preferably made of a conductive material and is preferably selected from at least one of poly silicon, poly germanium, metals such as Al, W, Ta, Ti, Ru, Pd, Rh, Re, Pt, and alloys thereof, metal-nitrides such as TaN and TiN, metal-silicon nitrides such as TaSiN, conductive oxides such as $RuO_2$ and $ReO_3$, fully silicided metals (FUSI) such as $CoSi_2$, NiSi and $TiSi_2$, fully germanided metals (FUGE), workfunction tunable metals, engineered materials to obtain a particular gate workfunction. Most preferred said gate contact is made of a metal of which the workfunction has been engineered specifically for the chosen nanowire material, the gate oxide material and gate oxide thickness (first and second semiconductor material) in order to get the desired threshold voltage of the T-FET.

The NW-TFET further comprises an electrical contact on each of the source region and drain region. Said electrical contact on each of the source region and drain region is a conductive material which is selected from at least one of a silicide containing structure (NiSi, $CoSi_2$, $TiSi_2$, and the like), a germanide containing structure, a metal containing structure, poly silicon or a combination thereof. Most preferred said electrical contact on each of the source region and drain region is a combination of a metal with a silicide.

In integrated circuits, the nanowire tunnel field effect transistor of the invention may be used as either an n-type transistor device or a p-type transistor device.

Figure 2:
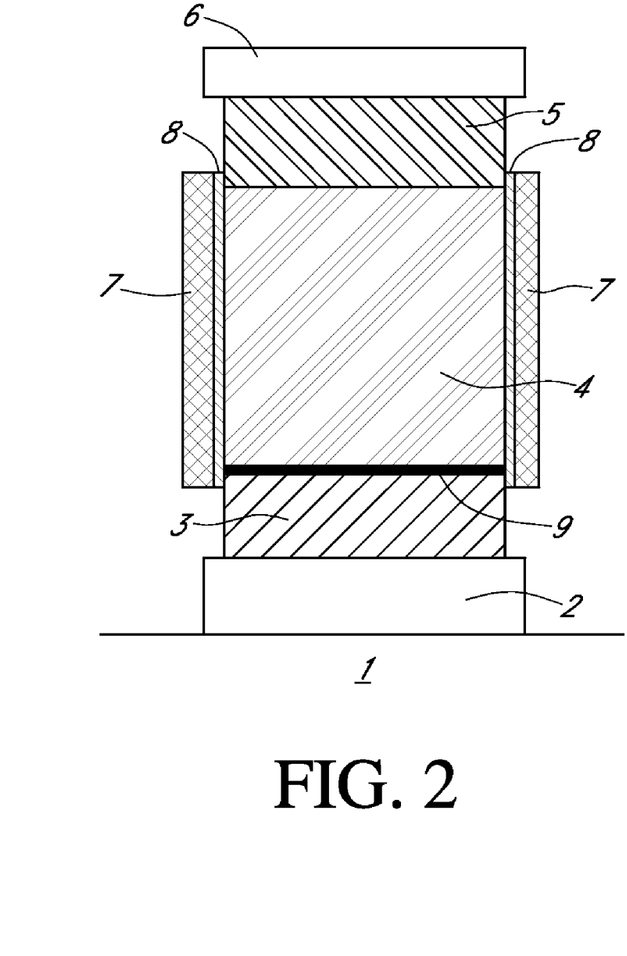
FIG. 2 illustrates a cross-section of the NW-TFET structure according to a preferred embodiment of the invention.
Figure 3:
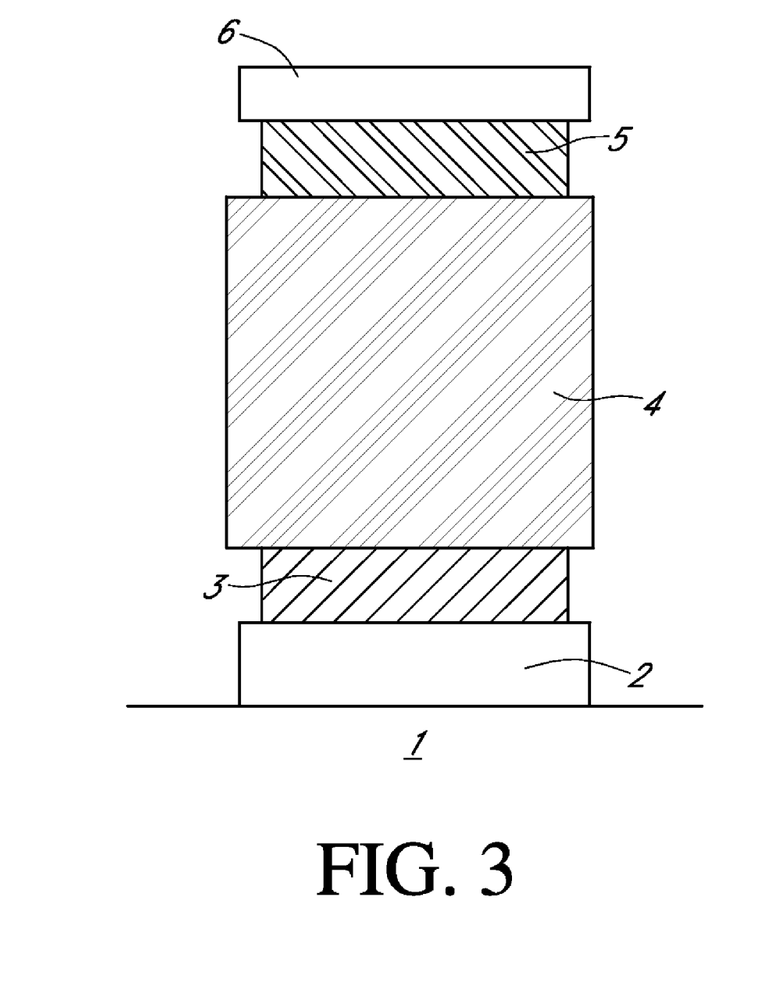
FIG. 3 illustrates a front view of the NW-TFET structure according to a preferred embodiment of the invention.

FIG. 2 illustrates a cross-section of the NW-TFET structure according to a preferred embodiment of the invention and FIG. 3 illustrates a front view of the NW-TFET structure according to a preferred embodiment of the invention.

In the example illustrated, the heterosection 9 does not extend out of the gate structure 7, 8. Just like with a MOSFET, what has to be avoided, is that part of the undoped channel (=center) region 4 is not covered by the gate structure 7, 8. The gate 7 will not have much effect on carrier density in the highly doped heterosection 9 (however, it will increase the capacitance with the source (or drain) region 3). In the figures, the gate 7 is covering the heterosection 9, but this is mainly because the heterosection 9 is very narrow. If the heterosection 9 is rather 50 nm as opposed to 3 nm, then the heterosection 9 will be partially outside of the gate structure 7, 8.

In a second aspect of the invention, a method is provided for the fabrication of a nanowire Tunnel Field Effect transistor. Hereinafter, the method according to an embodiment of the invention will be illustrated for a device according to a preferred embodiment, i.e. for an n-type NW-TFET comprising at least one vertical nanowire as shown in FIG. 2 (cross section) and FIG. 3 (front view). It has to be understood that this is not limiting the invention and that the method may also be applied to create a p-type NW-TFET comprising at least one vertical nanowire.

Figure 4:
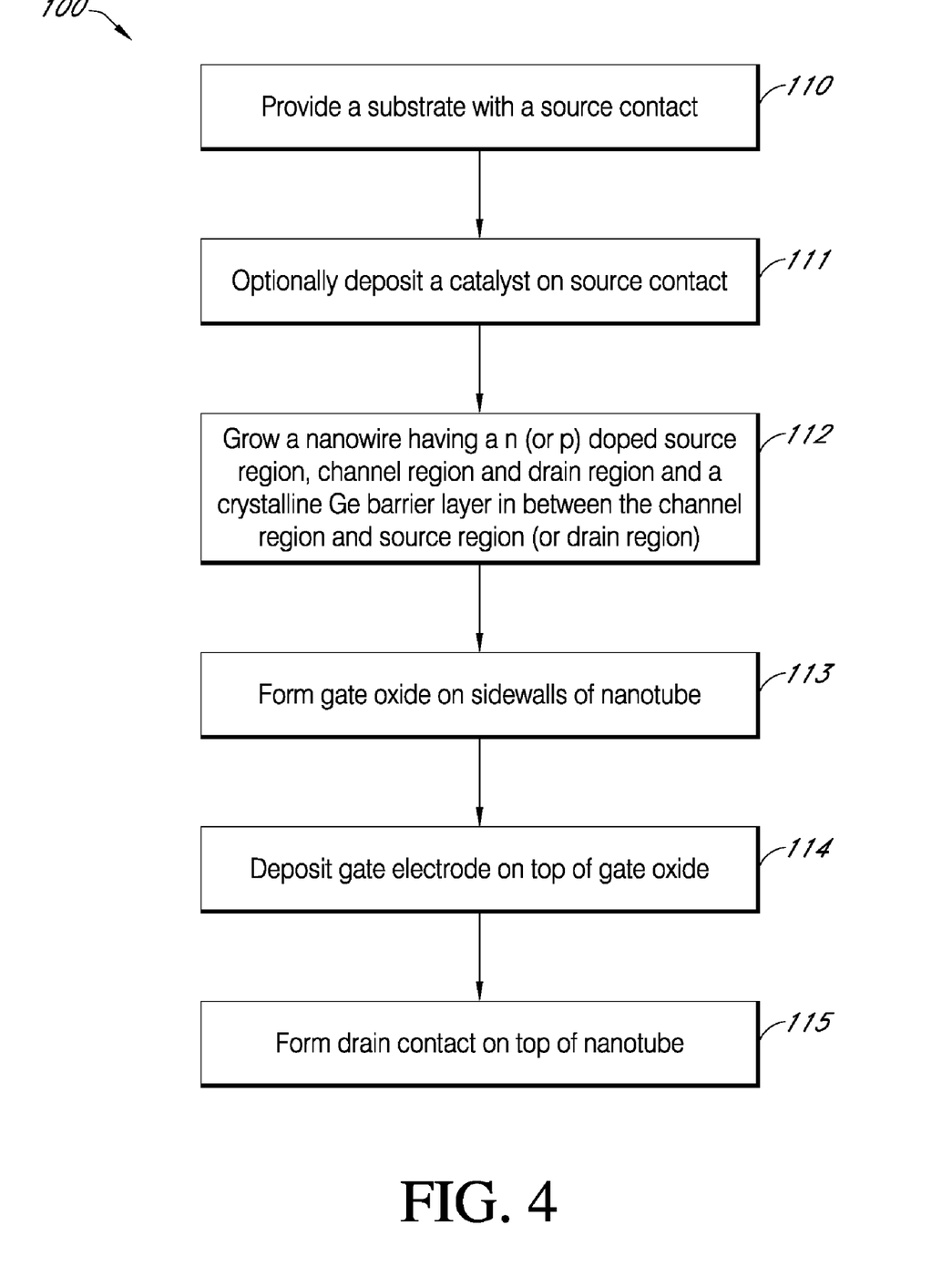
FIG. 4 illustrates a flow diagram of a preferred method for fabricating the NW-TFET of the present invention.

A preferred processing method is schematically illustrated in a flowchart 100 shown in FIG. 4 and will be described in detail below. It has, however, to be understood that this is only an example of a suitable method for forming a device according to the invention and that the sequence of the process steps as described hereinafter is not limiting the invention.

In a first step 110, a substrate 1 is provided. Preferably said substrate 1 is a semiconductor substrate such as a silicon substrate or a silicon on insulator (SOI) substrate but any other suitable substrate can be used as well such as, for example, glass, ceramics, etc. According to an embodiment of the invention, in said substrate 1 or alternatively on top of said substrate, a source contact 2 is created. The source contact 2, may be made of a conductive material, e.g. said source contact 2, may be a silicide containing structure (NiSi, $CoSi_2$, $TiSi_2$, and the like), a germanide containing structure, a metal containing structure, polysilicon or a combination thereof. Also disclosed are source contacts 2, formed of e.g. conductive oxides and even conductive polymers. In case the source contact 2 is a metal containing structure, all metals which form an ohmic contact with the material of a nanowire, or in other words all metals having a comparable work function with respect to the work function of the material of the nanowire, are preferred metals and may be used according to the invention. Preferably the source contact 2 is a silicide containing structure. The source contact 2, can be the starting point for growing the nanowire and can, at the same time, act as the catalyst for the nanowire growth. However, the latter is not necessarily essential.

In case the source contact can not be used as a catalyst for the subsequent nanowire growth, a catalyst needs to be deposited onto the source contact, step 111. Furthermore, the requirement of catalyst particles also depends on the technique used to form the nanowire.

In a next step 112, a nanowire is grown, a preferred method is e.g. by means of a VLS (Vapor-Liquid-Solid) process, but also any other suitable technique known by a person skilled in the art may be used to form the nanowires according to the invention. For example, the nanowire may be grown using techniques such as, for example, CVD (Chemical Vapor Deposition), MOCVD (Metal Organic Chemical Vapor Deposition), or PECVD (plasma enhanced chemical vapor deposition) processes. Alternatively, also PLD (Pulsed Laser Deposition), ECD (Electrochemical Deposition), e-beam or MBE (Molecular Beam Epitaxy) processes may be used to grow the nanowires.

During growth of the nanowire, different regions with different doping levels and different doping types need to be created to form the source region 3, the channel region 4, the drain region 5 and the heterosection 9 of the nanowire. The different regions in the nanowire can be doped during the growth process to obtain an n-type or p-type region. Alternatively, the doping of the nanowire may be performed after growth of the nanowire by means of an additional doping step. The doping in one specific region, e.g. source region/drain region is preferably uniform, but may also have a non-uniform doping profile.

During growth of the nanowire, first a source region 3 needs to be created. Said source region 3 is made of a first semiconductor material which is highly p doped in case of an n-type NW-TFET, or alternatively in case of a p-type NW-TFET said source region is highly n doped. More preferred the doping level of the source region is in the range of $10^{18}$/cc to $10^{21}$/cc. Most preferred the doping level of the source region is in the range of $10^{19}$/cc to $5.10^{20}$/cc.

In a next step (to create an n-type NW-TFET as presented in FIG. 2), a heterosection 9 is formed onto the source region 3. The heterosection 9 is made of a second semiconductor material which is such that it has a different lattice constant compared to the first semiconductor material used to form the source region 3 of the nanowire. Said second semiconductor material is highly doped and is selected from at least one of the group IV materials such as Si, Ge, C and binary compounds thereof, or group III/V materials such as In, Ga, As, Sb, Al, P, B, N and binary, tertiary and quaternary compounds thereof or group II/VI materials such as Cd, Zn, S, Se, Te, O and binary, tertiary and quaternary compounds thereof. Most preferred said second semiconductor material is germanium or $Si_{1-x}Ge_x$ with x>0.5. The doping level of the heterosection is preferably in the range of $10^{18}$/cc to $10^{21}$/cc, more preferred the doping level of the heterosection is in the range of $10^{19}$/cc to $5\times10^{20}$/cc.

Alternatively and also preferred, said heterosection can be made of metals (Al, W, Ta, Ti, Ru, Pd, Rh, Re, Pt, and alloys thereof), silicides, germanides, metal-nitrides such as TaN and TiN, conductive oxides such as $RuO_2$ and $ReO_2$, silicided metals such as $CoSi_2$, $NiSi_2$, metal germanides and alloys and mixtures thereof.

Subsequently, the channel region of the NW-TFET is formed in the nanowire, said channel region is preferably made of the first semiconductor material, although other suitable/compatible materials can be used. Preferably the doping level of the channel region is in the range of undoped up to $10^{16}$/cc doping. More preferred the doping level of the channel region is in the range of undoped up to $10^{14}$/cc doping.

In a next step, a drain region 5 needs to be created on top of the channel region. Said drain region 5 is made of a first semiconductor material which is highly n doped in case of an n-type NW-TFET (or alternatively in case of an n-type NW-TFET said drain region 5 is highly p doped. More preferred the doping level of the drain region is in the range of $10^{18}$/cc to $10^{21}$/cc. Most preferred the doping level of the drain region is in the range of $10^{19}$/cc to $5.10^{20}$/cc.

In a next step 113, 114, a gate structure needs to be formed onto the sidewalls of the nanowire, more specifically onto the sidewalls of the channel region of the nanowire. Said gate structure comprises a gate oxide 8 (also referred to as gate dielectric) and a gate electrode 7 (also referred to as gate contact). First the gate oxide 8 is formed and deposited directly onto the channel region 4 of the nanowire 113. Most preferred, said gate oxide 8 completely covers the outer sidewalls of the channel region 4. To obtain a complete coverage of the channel region, a small overlap of the gate oxide with the highly-doped drain and source region is desirable. The gate oxide can be restricted to part of the nanowire (i.e. channel region), by means of a sacrificial layer, which is etched away before the oxide deposition (this implies that e.g. other materials are deposited onto the wafer after nanowire growth, such that the nanowire is embedded in other materials. This should be done in such a way that a sacrificial layer lines up with the channel region of the nanowire. After removal of the sacrificial material, a dielectric, e.g. an oxide, can be deposited onto the nanowire channel region.

Onto the gate dielectric, e.g. gate oxide, a gate contact (electrode) is deposited, step 114, said gate contact is deposited on top of said gate dielectric, e.g. gate oxide, and is preferably covering the whole gate oxide.

The gate dielectric is preferably selected from at least one of silicon based oxide (e.g. silicon dioxide, silicon oxy nitride) aluminum oxide, high-k oxides (oxides, nitrided oxides), silicates and nitrided silicates of transition metals such as Hf, Ta, Ti, Nb, V, Y, Zr. Most preferred said gate oxide is a high-k oxide such as hafnium oxide. The thickness of the gate oxide is preferably in the range of 0.5 nm to 20 nm.

The gate contact is preferably made of a conductive material and is preferably selected from at least one of poly silicon, poly germanium, metals such as Al, W, Ta, Ti, Ru, Pd, Rh, Re, Pt, and alloys thereof, metal-nitrides such as TaN and TiN, metal-silicon nitrides such as TaSiN, conductive oxides such as $RuO_2$ and $ReO_3$, fully silicided metals (FUSI) such as $CoSi_2$, NiSi and $TiSi_2$, fully germanided metals (FUGE), workfunction tunable metals, engineered materials to obtain a particular gate workfunction. Most preferred said gate contact is made of a metal of which the workfunction has been engineered specifically for the chosen nanowire material, the gate oxide material and gate oxide thickness.

Finally 115 electrical contact is formed on the drain region (situated on top of the nanowire. Said electrical contact is preferably a conductive material which is selected from at least one of a silicide containing structure ($NiSi$, $CoSi_2$, $TiSi_2$, or the like), a germanide containing structure, a metal containing structure, poly silicon or a combination thereof. Most preferred said electrical contact is a combination of a metal with a silicide.

In case the nanowire is not doped during the growth process, an extra doping step may be advantageous. For example, implantation of dopant elements followed by activation of the dopant elements by e.g. annealing can be applied to achieve n-type or p-type region in the nanowire. Alternatively, a layer, which is also referred to as dopant layer and which comprises dopant elements can be deposited or a dopant metal can be selectively deposited, e.g. with electrochemical deposition, onto the nanowire regions (not shown). An anneal step may then be applied so as to incorporate the dopant into the nanowire region, resulting in an n-type or p-type region.

The whole processing sequence to obtain a NW-TFET, in the example shown in FIG. 2 for an n-type NW-TFET, as described in the previous steps can be repeated to build a second NW-TFET structure on top of the existing NW-TFET structure starting on the drain contact. In case the first NW-TFET structure is an n-type NW-TFET structure, the second structure may preferably be a p-type NW-TFET structure.

EXAMPLES

Example 1

Simulations with Device Simulator MEDICI to Determine the Characteristics of a (Silicon) NW-TFET with a Highly-Doped Ge Section at the Tunnel Barrier TFETs typically suffer from low on-currents, a drawback related to the large resistance of the tunnel barrier. This simulation illustrated below demonstrates that high on-currents can be achieved for a TFET with a germanium (Ge) tunnel barrier in an otherwise silicon (Si) channel. Such a configuration is only possible when nanowires are used, such that the lattice mismatch between silicon and germanium does not result in a highly defective interface. The simulations predict a dynamic power reduction of up to a factor of at least 5, as well as a static power reduction of at least a factor of 2 compared to conventional MOSFET configurations. Multiple layers of logic can therefore be envisioned with these nanowire Si/Ge TFETs resulting in ultra-high on-chip transistor densities.

Figure 6A:
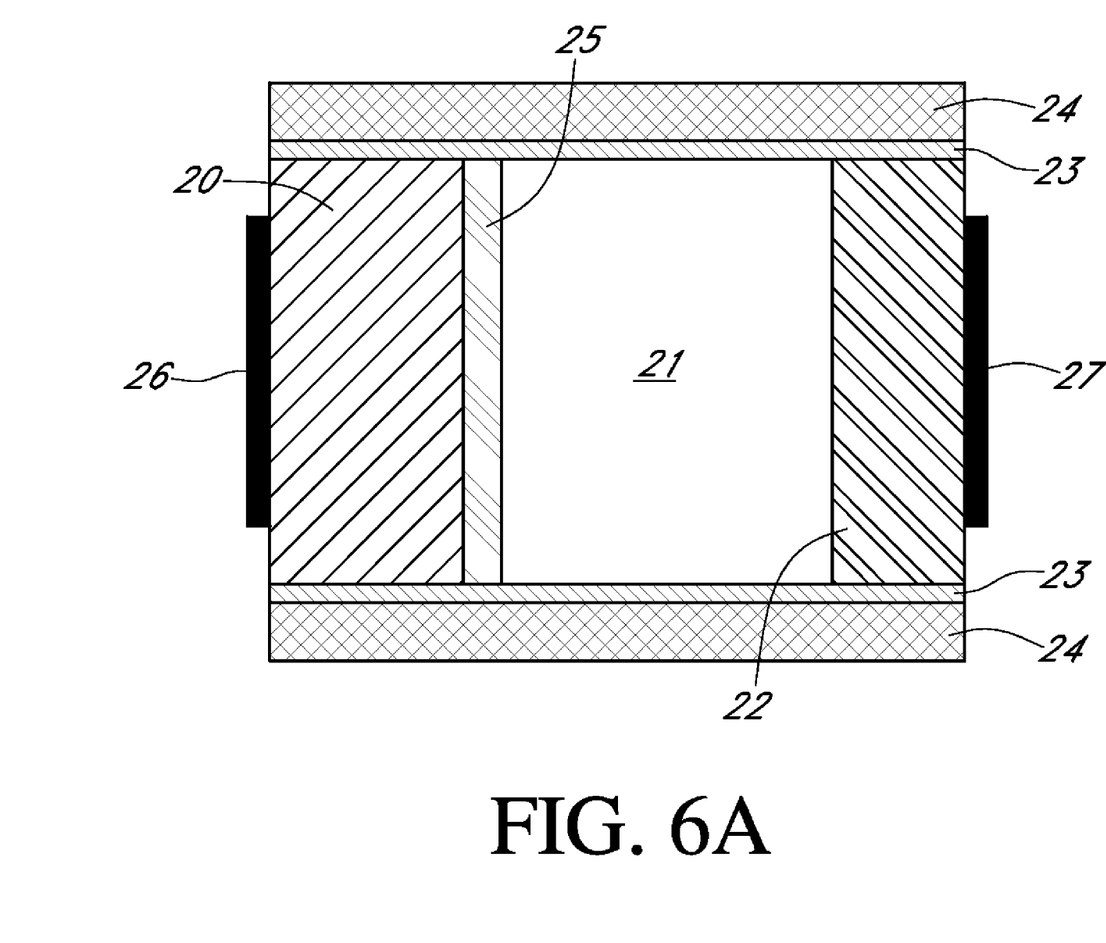
FIG. 6A shows a TFET structure used for simulations. The structure is 2-dimensional and has a double-gate. The height of the central part (between the oxides) is 100 nm, and the height of the hafnium oxide is 4 nm. The width of the highly p-doped section is 65 nm, the barrier section is 3 nm, the width of the channel section is 100 nm, and the width of the highly n-doped section is 44 nm. The 3 nm barrier section is made of either Si, $Si_{0.5}Ge_{0.5}$ or Ge.

The simulations are performed with device simulator "MEDICI" to determine the characteristics of a (silicon) NW-TFET with a highly-doped Ge section at the tunnel barrier. The NW-TFET used for the simulation is shown in FIG. 6A. The NW-TFET structure is 2-dimensional and has a double-gate. The height of the central part (between the oxides) is 100 nm, and the height of the hafnium oxide is 4 nm. The width of the highly p-doped section is 65 nm, the heterosection is 3 nm, the width of the channel region is 100 nm, and the width of the highly n-doped section is 44 nm. The 3 nm heterosection is made of either Si, $Si_{0.5}Ge_{0.5}$ or Ge. The NW-TFET structure can be fabricated using the state of the art technology taking into account that nanowires can cope with the lattice mismatch between silicon and germanium. The most important dimensions in the NW-TFET structure to be taken into account for the electrical performance are the oxide thickness and the width of the channel region. Further parameters of importance are the doping of the source and drain sections, as well as the material used for the heterosection. The doping of the channel region is not critical, as long as it is lowly doped. The doping concentrations and dopant type in the NW-TFET used to perform the simulations are summarized in Table 1.

TABLE 1

Table 2: Doping concentrations and dopant type in the NW-TFET used to perform the simulations.

| Nanowire region | Dopant type/concentration | Semiconductor material |
|---|---|---|
| Source region | p-type, $10^{20}$/cc | Si |
| Channel region | n-type, $10^{13}$/cc | Si |
| Heterosection | p-type, $10^{20}$/cc | Ge |
| Drain region | n-type, $10^{20}$/cc | Si |

Figure 6B:
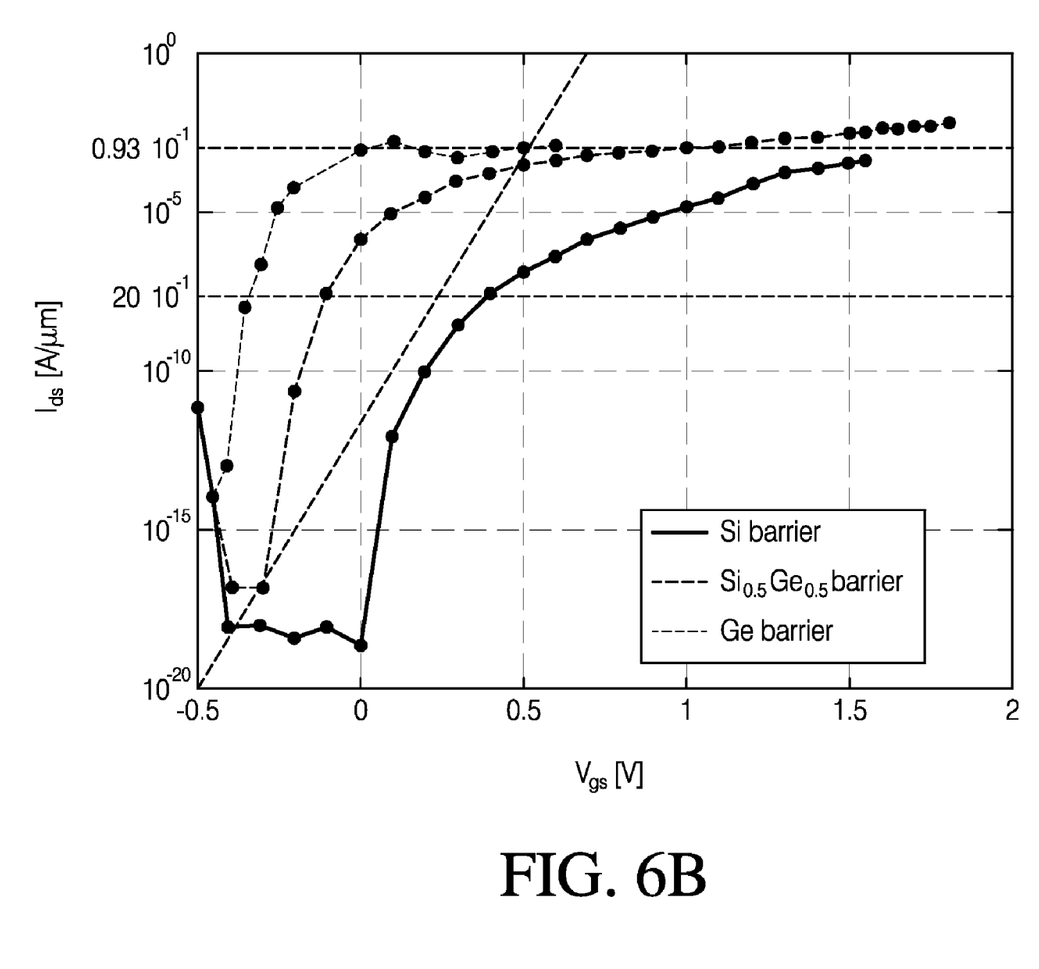
FIG. 6B illustrates the source-drain current $I_{ds}$ as a function of gate voltage $V_{gate}$ for the TFET structure as shown in FIG. 6A with a Si barrier, a $Si_{0.5}Ge_{0.5}$ barrier and a Ge barrier. The horizontal dashed lines indicate the target values for the off-current and the on-current for an LOP-design for node 14 (year 2020). The dashed line at an angle represents a 60 mV/dec slope, which is the best subthreshold slope which can be achieved with conventional MOSFETs. The voltage $V_{ds}$=1 V for all curves.

The electrical characteristics of the NW-TFET structure as shown in FIG. 6A are presented in FIG. 6B. The source-drain current is the current underneath one of the double-gates only, to allow a fair comparison with a single-gate MOSFET structure. It can be observed that all devices can be turned off properly (see off-current requirements in Table 2). To achieve an on-current of 0.93 mA/μm (target for LOP, which is the most important design strategy, see Table 2) with the all-silicon NW-TFET would require very high gate voltages, as can be observed. However, for the NW-TFET with the Ge-section, such currents can be achieved at very low gate voltages.

TABLE 2

Table 2: International Technology Roadmap for Semiconductors (ITRS) roadmap values for node 14 (year 2020) of the on-current and off-current of a MOSFET for different design approaches.

| Design strategy | NMOS drive current | source-drain off-current |
|---|---|---|
| Low operating power (LOP) | 0.930 mA/μm | 20 nA/μm |
| Low stand-by power (LSTP) | 1.3-1.4 mA/μm | 100-160 pA/μm |
| High performance (HP) | 3 mA/μm | 110 nA/μm |

The important figure of merit for the gate voltage is not the absolute gate voltage at which the required on-current is reached, but rather the difference between the gate voltage needed to turn the device off and the gate voltage needed to turn the device on. This is because gate work function engineering should allow to fabricate a gate material with a work function such that the device turns off at $V_{gs}=0$ V (and therefore turns on at a gate voltage equal to the difference between the observed gate voltage of the on-state and the observed gate-voltage of the off-state). In the case of the structure with the Ge-section, this gate voltage switch is $\Delta V_{gs}=0.45$ V. For comparison, the maximum subthreshold slope of a MOSFET device is shown in FIG. 6B, and it is clear that with such a subthreshold slope, a gate voltage swing of $\Delta V_{gs}=0.45$ V can never be achieved.

The smaller gate voltage swing allows to reduce the supply voltage (it has not been shown, but decreasing the voltage $V_{ds}$ to 0.45 V is not expected to change the curves of FIG. 6B, because the current is mainly determined by the width of the tunnel barrier and is not very dependent on $V_{ds}$, as long as $V_{ds}$ doesn't get too small). This reduction in supply voltage in its turn reduces the power dissipation, both the static power ($=I_{leakage} \times V_{supply}$) as well as the dynamic power ($=C \times f \times V^2_{supply}$). With a planar conventional MOSFET design, it is questionable whether the supply voltage will ever be reduced below 1 V (due to the fixed subthreshold slope).

Figure 5B:
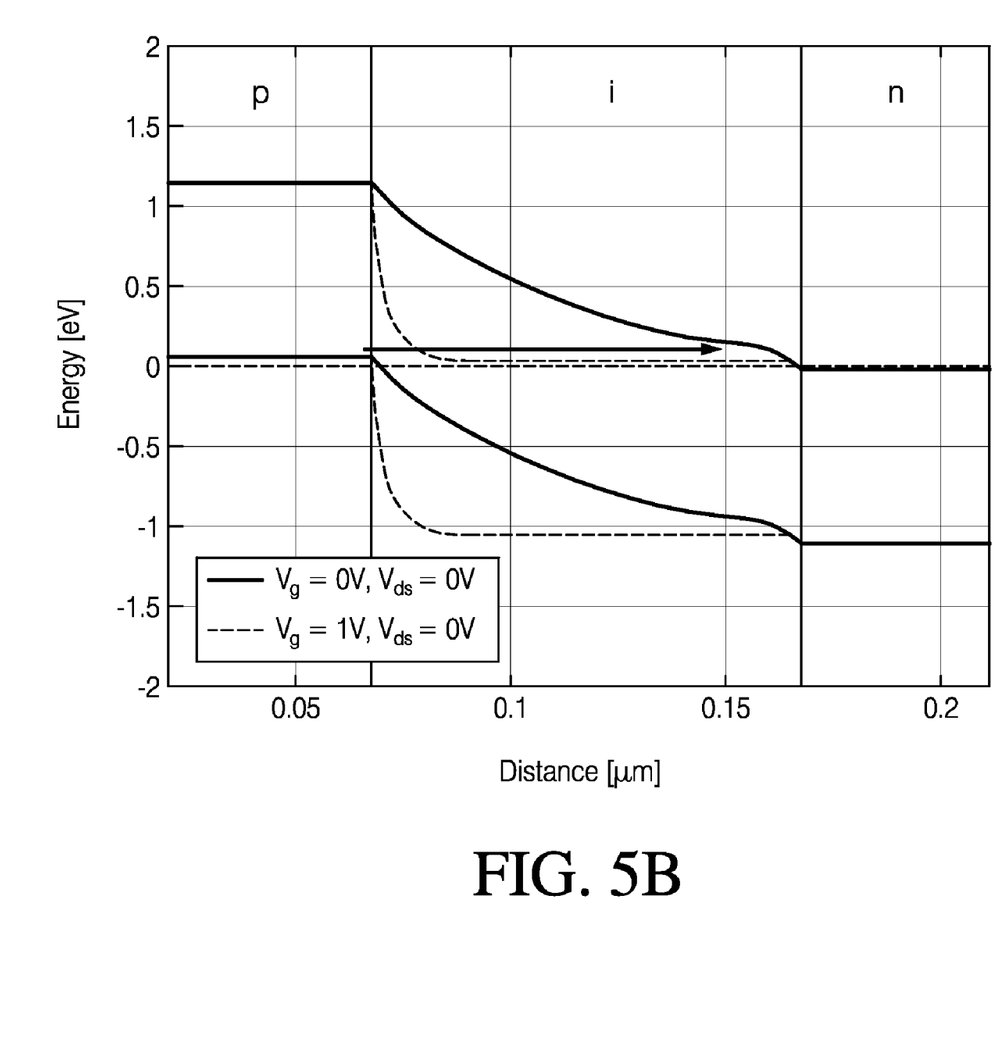
FIG. 5B shows a typical energy band diagram of a TFET as shown in FIG. 1 (prior art) without and with applied gate bias (no drain-source bias applied). The arrows indicate the tunnel barrier which needs to be crossed.

When a comparison is made with a MOSFET which operates at 1 V, it can be concluded that the dynamic power dissipation of the proposed Ge-barrier NW-TFET will be smaller by a factor of $(1/0.45)^2=5$, and that the static power dissipation will be smaller by at least a factor of $1/0.45 \approx 2$ (although we expect that a much smaller leakage power can be easily obtained if this is a priority by slight increasing the supply voltage: see FIG. 5 where it can be observed that the current $I_{off}$ can be significantly reduced below the ITRS requirement). The proposed NW-TFET structure therefore fulfills the ITRS requirements of node 14 (year 2020) which cannot be achieved by a conventional MOSFET.

As has been described above, tunnel field-effect transistors (TFETs) are regarded as successors of metal-oxide semiconductor field-effect transistors (MOSFETs), but silicon-based TFETs typically suffer from low on-currents, a drawback related to the large resistance of the tunnel barrier. To achieve higher on-currents a TFET with a germanium (Ge) tunnel barrier in an otherwise silicon (Si) channel is used. A nanowire-based structure with a heterosection (9) is introduced such that the lattice mismatch between silicon and germanium does not result in a highly defective interface. A dynamic power reduction as well as a static power reduction can result, compared to conventional MOSFET configurations. Multiple layers of logic can therefore be envisioned with these nanowire Si/Ge TFETs resulting in ultra-high on-chip transistor densities.

What is claimed is:

1. A Tunnel Field Effect Transistor comprising at least one nanowire, said nanowire comprising:
    a source region comprising a first semiconductor material which is highly doped according to a first conductivity type;
    a drain region comprising the first semiconductor material which is highly doped according to a second conductivity type;
    a channel region comprising the first semiconductor material, which is lowly doped according to the second conductivity type, wherein the channel region is situated between the source region and drain region;
    a heterosection comprising a material having a different lattice constant from the first semiconductor material, wherein the heterosection is situated between the channel region and one of the source region and the drain region, wherein an interface between the heterosection and a main part of the nanowire is substantially defect-free; and
    a gate structure on the channel region of the nanowire, said gate structure comprising a gate dielectric, and a gate contact on top of said gate dielectric.

2. The Tunnel Field Effect Transistor according to claim 1, wherein the gate structure completely covers the channel region of the nanowire.

3. The Tunnel Field Effect Transistor according to claim 1, further comprising an electrical contact on each of the source region and the drain region.

4. The Tunnel Field Effect Transistor according to claim 1, wherein said first semiconductor material comprises at least one material selected from the group consisting of group IV materials, binary compounds of group IV materials, group III/V materials, binary compounds of group III/V materials, tertiary compounds of group III/V materials, quaternary compounds of group III/V materials, group II/VI materials, binary compounds of group II/VI materials, tertiary compounds of group II/VI materials, and quaternary compounds of group II/VI materials.

5. The Tunnel Field Effect Transistor according to claim 1, wherein said first semiconductor material comprises silicon.

6. The Tunnel Field Effect Transistor according to claim 1, wherein said heterosection comprises a second semiconductor material which has a different lattice constant from the first semiconductor material of the nanowire.

7. The Tunnel Field Effect Transistor according to claim 1, wherein said second semiconductor material comprises at least one material selected from the group consisting of group IV materials, binary compounds of group IV materials, group III/V materials, binary compounds of group III/V materials, tertiary compounds of group III/V materials, quaternary compounds of group III/V materials, group II/VI materials, binary compounds of group II/VI materials, tertiary compounds of group II/VI materials, and quaternary compounds of group II/VI materials.

8. The Tunnel Field Effect Transistor according to claim 1, wherein said second semiconductor material comprises germanium or $Si_{1-x}Ge_x$ with $x>0.5$.

9. The Tunnel Field Effect Transistor according to claim 1, wherein said heterosection comprises at least one material selected from the group consisting of aluminum, tungsten, tantalum, titanium, ruthenium, palladium, rhodium, rhenium, platinum, silicides, germanides, metal-nitrides, conductive oxides, silicided metals, metal germanides, alloys thereof, and mixtures thereof.

10. The Tunnel Field Effect Transistor according to claim 1, wherein a diameter of the nanowire is from about 1 nm to about 500 nm.

11. The Tunnel Field Effect Transistor according to claim 1, wherein a diameter of the nanowire is from about 2 nm to about 200 nm.

12. The Tunnel Field Effect Transistor according to claim 1, wherein a length of the nanowire is from about 5 nm to about 2 µm.

13. The Tunnel Field Effect Transistor according to claim 1, wherein a length of the nanowire is from about 10 nm to about 1 µm.

14. The Tunnel Field Effect Transistor according to claim 1, wherein said gate dielectric comprises at least one material selected from the group consisting of silicon based oxide, aluminum oxide, high-k oxides, silicates of transition metals, and nitrided silicates of transition metals.

15. The Tunnel Field Effect Transistor according to claim 14, wherein said gate dielectric is hafnium oxide.

16. The Tunnel Field Effect Transistor according to claim 1, wherein said gate contact comprises at least one conductive material selected from the group consisting of poly silicon, poly germanium, a metal, a metal alloy, metal-nitrides, metal-silicon nitrides, conductive oxides, fully silicided metals, fully germanided metals, workfunction tunable metals, and engineered materials to obtain a particular gate workfunction.

17. The Tunnel Field Effect Transistor according to claim 1, wherein said gate contact comprises a metal of which the workfunction has been engineered specifically for the first semiconductor material, the second semiconductor material, the gate dielectric, and a gate dielectric thickness.

18. The Tunnel Field Effect Transistor according to claim 1, wherein said electrical contact on each of the source region and the drain region comprises at least one conductive material selected from the group consisting of a silicide containing structure, a germanide containing structure, a metal containing structure, poly silicon, and combinations thereof.

19. The Tunnel Field Effect Transistor according to claim 1, wherein said electrical contact on each of the source region and the drain region comprises a combination of a metal with a silicide.

20. The Tunnel Field Effect Transistor according to claim 1, wherein a length of said heterosection is from about 1 nm to about 50 nm.

21. The Tunnel Field Effect Transistor according to claim 1, wherein a length of said heterosection is from about 2 nm to about 10 nm.

22. The Tunnel Field Effect Transistor according to claim 1, wherein a length of said channel region is from about 1 nm to about 1000 nm.

23. The Tunnel Field Effect Transistor according to claim 1, wherein a length of said channel region is from about 1 nm to about 100 nm.

24. The Tunnel Field Effect Transistor according to claim 1, wherein a thickness of the gate dielectric is from about 0.5 nm to about 20 nm.

25. The Tunnel Field Effect Transistor according to claim 1, wherein a doping level of the source region and the drain region is from about $10^{18}$/cc to about $10^{21}$/cc.

26. The Tunnel Field Effect Transistor according to claim 1, wherein a doping level of the source region and the drain region is from about $10^{19}$/cc to about $5\times10^{20}$/cc.

27. The Tunnel Field Effect Transistor according to claim 1, wherein a doping level of the heterosection is from about $10^{18}$/cc to about $10^{21}$/cc.

28. The Tunnel Field Effect Transistor according to claim 1, wherein a doping level of the heterosection is from about $10^{19}$/cc to about $5\times10^{20}$/cc.

29. The Tunnel Field Effect Transistor according to claim 1, wherein a doping level of the channel region is from undoped to about $10^{16}$/cc doping.

30. The Tunnel Field Effect Transistor according to claim 1, wherein a doping level of the channel region is from undoped to about $10^{14}$/cc doping.

31. The Tunnel Field Effect Transistor according to claim 1, wherein the tunnel field effect transistor semiconductor device has an ON current of less than 1 mA/um.

32. The Tunnel Field Effect Transistor according to claim 1, wherein the heterosection comprises a metal.

33. The Tunnel Field Effect Transistor according to claim 1, consisting of at least one nanowire.

* * * * *